United States Patent
Colahan

(10) Patent No.: US 8,878,079 B2
(45) Date of Patent: Nov. 4, 2014

(54) ELECTRO-MAGNETIC INTERFACE TERMINATION STRUCTURES AND SYSTEMS AND METHODS FOR MAKING THE SAME

(75) Inventor: Ian P. Colahan, Palo Alto, CA (US)

(73) Assignee: Apple Inc., Cupertino, CA (US)

( * ) Notice: Subject to any disclaimer, the term of this patent is extended or adjusted under 35 U.S.C. 154(b) by 251 days.

(21) Appl. No.: 13/346,096

(22) Filed: Jan. 9, 2012

(65) Prior Publication Data

US 2013/0175080 A1    Jul. 11, 2013

(51) Int. Cl.
*H05K 9/00* (2006.01)
*H01R 43/00* (2006.01)

(52) U.S. Cl.
USPC .............................. 174/357; 174/359; 29/825

(58) Field of Classification Search
CPC ....... H05K 9/00; H05K 9/0058; H01R 43/00; H01R 13/658; H01R 9/05; G06F 1/182
USPC .................................................. 174/359, 357
See application file for complete search history.

(56) References Cited

U.S. PATENT DOCUMENTS

| | | | |
|---|---|---|---|
| 5,823,803 A * | 10/1998 | Majors | 439/98 |
| 6,932,640 B1 | 8/2005 | Sung | |
| 8,002,572 B2 * | 8/2011 | Lu et al. | 439/405 |
| 2005/0227537 A1 | 10/2005 | Peng | |
| 2007/0082509 A1 * | 4/2007 | Kuo | 439/45 |
| 2012/0053430 A1 * | 3/2012 | Flagler | 600/323 |
| 2012/0081898 A1 * | 4/2012 | Cave et al. | 362/249.01 |
| 2013/0149899 A1 * | 6/2013 | Schroll et al. | 439/607.01 |

* cited by examiner

*Primary Examiner* — Timothy Thompson
*Assistant Examiner* — Charles Pizzuto
(74) *Attorney, Agent, or Firm* — Van Court & Aldridge LLP

(57) ABSTRACT

Compact, high-speed data cable structures that include shielding to protect from electro-magnetic interference (EMI) are disclosed. The cable structures can include the conductors necessary to communicate signals that comply with the HDMI™ standard. The cable structures are formed for use with portable electronic devices and may include specific connectors, such as the 30 pin connector found on many products, such as the iPhone™ from Apple Inc. The cable structures include a micro crimp that enables the cable to be smaller than traditional high-speed data cables. The cable structures also include a shield body housing formed from a pair of virtually identical halves that are mated together to form the housing.

20 Claims, 7 Drawing Sheets

ELECTRO-MAGNETIC INTERFACE TERMINATION STRUCTURES AND SYSTEMS AND METHODS FOR MAKING THE SAME

BACKGROUND

Various electronic devices are in ever increasing use in society. These devices can often be connected to other electronic devices so that, for example, content on one device can be displayed on another device. In many instances, the cables used to connect such devices together often need just a small number of conductors, such as when the interconnection is based on USB communications. This can make for relatively simple wiring of the connector. In other instances, however, the interconnection requirements are greater, such as when high definition video is being transferred via high definition multimedia interface (HDMI). Under such circumstances, there is a need for both an increased number of conductors, as well as additional demands based on the higher-speeds that data will be transferred. The demands on conventional high-speed cables, such as standard HDMI-to-HDMI cables, are relatively low, since in most instances, those cables are connected at both ends and may never be touched again (e.g., until a new or replacement device is installed). In addition, for all practical purposes, the size of the connector does not matter, at least because in most instances, the cables are located behind the devices, such as a large, flat screen TV.

Cables for interconnection to portable electronic devices, however, have significantly higher requirements because they will likely be put on and taken off of devices many, many times. Thus, the user may inadvertently apply forces that could potentially damage the cable, particularly at places where the cable is terminated into the connector. In addition, the presence of high-speed signals within the cable increases the shielding requirements. Moreover, when cables are going to be used with portable electronic devices, it may be desirable for those cables to be relatively small and compact. The one or more cables can be manufactured using different approaches.

SUMMARY

Electro-magnetic termination structures and systems and methods for manufacturing cables that have those structures are disclosed.

A cable structure can be utilized to connect a portable electronic device to another device. The cable structure can include electro-magnetic interference (EMI) shielding termination that substantially encloses the location where the individual conductors of the cable are terminated within the connector. For example, in some instances, it may be desirable to terminate the cable on to a micro printed circuit board that can be included within the assembled connector itself. In some instances, the portable electronic device's input/output port may be a specific type of connector that can be used in multiple applications. One such instance is the 30-pin connector that is often found on portable electronic devices manufactured by Apple Inc. Such connectors are often compact and designed to take up a minimal amount of space so, for example, a user may conveniently carry them in one's pocket.

In addition, because the dimensions of some of the conductors may be different than the dimensions of other conductors within the bundle being routed through the cable structure, additional considerations must be made within the connector where termination occurs. In at least one embodiment, the shield termination structure includes a pair of substantially similar metal halves that, when assembled together, form a shell that substantially covers the open end of the cable and the micro printed circuit board that the conductors of the cable are attached to. A rear portion of the shell can be electrically coupled to a shield layer of the cable, such as the braid layer that is often used for shielding in electrical cables, as described below.

In at least one embodiment, a micro-crimp can be utilized that can be slid over the cable prior to termination. Then, the micro-crimp can be slid back into place such that it substantially abuts the micro printed circuit board, at which point the crimp can be electrically coupled to the cable braid (such as via soldering). The micro-crimp, which can thereby provide a complete 360 degree termination of the braid, may also include tabs that can be interlocked with the shell to form a complete EMI shield.

BRIEF DESCRIPTION OF THE DRAWINGS

The above and other aspects and advantages of the invention will become more apparent upon consideration of the following detailed description, taken in conjunction with accompanying drawings, in which like reference characters refer to like parts throughout, and in which:

FIGS. 4A-4C show various illustrative views of a portion of an EMI shield in accordance with some embodiments of the invention, wherein FIG. 4B is a cross-sectional view taken from line B-B of FIG. 4A;

DETAILED DESCRIPTION OF THE DISCLOSURE

Cable structures having electro-magnetic interference termination techniques are disclosed. The cable structures utilize various non-cable components such as, for example, a crimp, a casing assembly, and/or interlocking connection points to provide a cable capable of transmitting data at high-speeds, while having significantly reduced risk of EMI. The cable structure can include some of the components, such as the casing assembly (in which case the wire braid could be terminated directly to the casing—a technique that may have reduced effectiveness versus other techniques disclosed herein).

Cable structures according to embodiments of this invention provide aesthetically pleasing interface connections between the non-cable components and the cable itself. The cable structures can be small, compact structures that can, for example, be carried in a pocket or small bag. This can make it easier for a user to bring a cable manufactured according to the techniques disclosed herein with the portable electronic device in order to make it easier to share content stored on the device with others.

Figure 1:
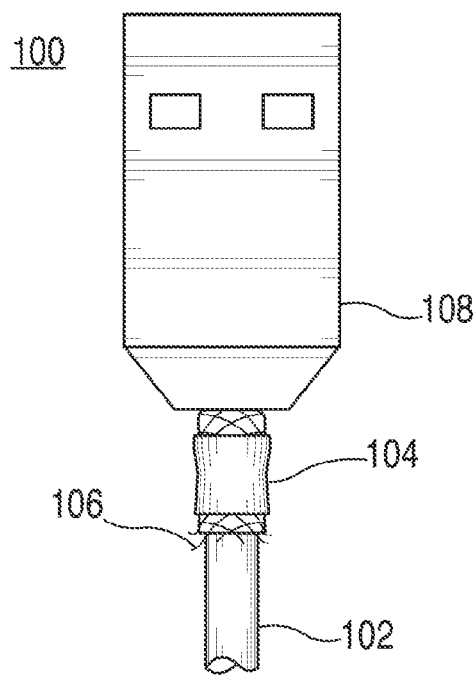
FIG. 1 illustrates conventional electro-magnetic interference cable termination techniques.

FIG. 1 shows an example of an existing USB cable that uses conventional techniques for electro-magnetic interference avoidance. Cable assembly 100 includes cable 102, extended crimp 104, wire braid 106 and shield body 108. Shield body 108 is essentially a metal box that completely encases the USB connector. In addition, shield body 108 is often used to help users align the USB connector with the socket when mating a cable with a device.

Cable assembly 100 can be manufactured by terminating the conductors at the end of the wire on to the USB connector board (not shown). At some time prior to the conductors being terminated, the wire braid of the cable would be folded back on to the end of cable 102 (as is shown by reference numeral 106 in FIG. 1). The shield body 108 can then be assembled to cover the terminated conductors, and during that assembly process, crimp 104 would be applied to secure shield braid 106 in place. Crimp 104 can then be electrically connected to shield body 108 through a technique such as by soldering. The electrical shielding will be further enhanced when shield body 108 is inserted into a USB socket.

While this technique may address many common concerns, it may not address issues related to high-speed signals, such as when utilizing HDMI signals that require fifteen conductors versus the four conductors required for USB transmissions. Additionally, USB connections are not generally suited for high-speed data transmission, at least because USB connections do not have to meet the same performance requirements as high-speed connections, such as HDMI. Moreover, traditional connectors and cable assemblies are typically bulky, heavy products, at least in part, because they are not intended to be transported and connected/reconnected to devices repeatedly.

Figure 2:
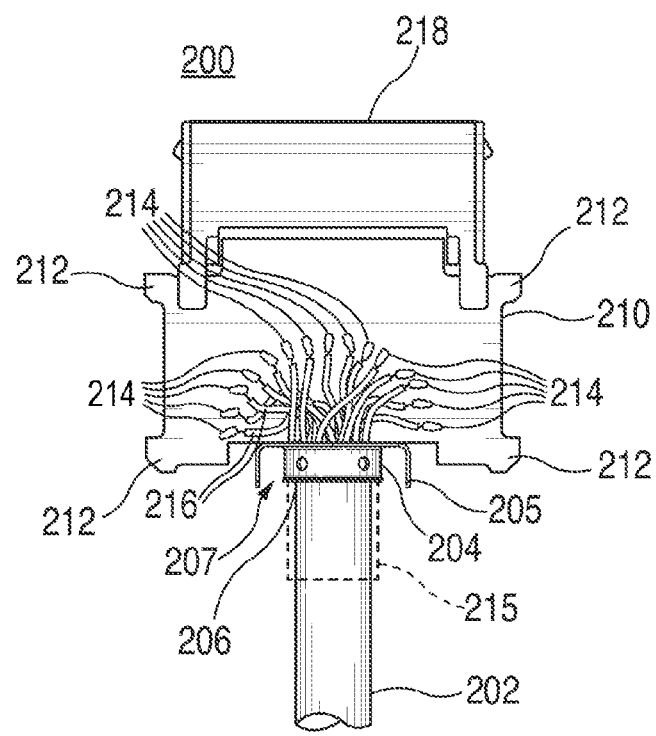
FIG. 2 shows an illustrative view of a portion of a cable terminated to prevent electro-magnetic interference in accordance with some embodiments of the invention.

FIG. 2 shows a top-level schematic view of a connector assembly 200 that is designed and constructed in accordance with the present invention. Connector assembly 200 includes, for example, additional conductors beyond the traditional four conductors of a USB interface. FIG. 2 shows fifteen conductors begin terminated, but the same techniques shown and described herein could be used for more or less conductors as well. While HDMI may require fifteen conductors, it may be desired to have a cable that provides both HDMI and a USB interface, in which case nineteen different conductors may be needed for the signals to be transmitted and received properly using a single cable.

Cable assembly 200 includes cable 202, micro crimp portion 204, base portion 205 (micro crimp portion 204 and base portion 205 can be two different pieces of a single micro crimp 207 that may be, for example, formed from a stamped piece of sheet metal), wire braid 206, micro printed circuit board (PCB) 210 that can include alignment tabs 212, interface termination points 214, conductors 216 and connector can 218 (the metal exterior portion of the connector). As shown, connector can 218 is a 30 pin connector, such as the 30 pin connector that is included on many portable electronic devices provided by Apple Inc., such as the iPod and iPhone devices). This is a non-standard interface for data such as HDMI (which, pursuant to the HDMI standard, normally utilizes a 19 pin connector that is shaped somewhat like a trapezoid). Thus, one issue that is addressed by the present invention is providing a reliable way to extract high-speed data signals from a portable electronic device such that they can be transmitted to another device (such as via an HDMI-to-30 pin connector cable). This is desirable, at least in part, because portable electronic devices often cannot be equipped with the numerous "standard" connectors that various different protocols require.

Cable assembly 200, in accordance with the techniques of the present invention, can be utilized for the transmission and receipt of high-speed data signals, such as HDMI signals. In particular, each of fifteen individual conductors 216 is electrically coupled to a different termination point 214. It should be noted that some of the individual conductors might be of varying thickness, which could potentially complicate the termination and EMI shielding process. For example, while FIG. 2 shows that all fifteen conductors are fanned out in a relatively even manner, it is likely not to be the case during actual assembly, at least because cable 202 is substantially tubular which may cause the conductors to be stacked on top of each other as they exit the cable. This can affect the height that the shield body (see, for example, FIGS. 4A-4C below) must provide clearance for, which also can affect the compactness of the overall cable assembly.

Micro crimp 207, as described above, can be formed from sheet metal during a stamping process, and is shown and described in more detail with regard to FIGS. 3A-3C below. With regard to what is shown in FIG. 2, however, it can been seen that the flat portion of micro crimp 207 can be located substantially abut one edge of printed circuit board 210 such that when micro crimp 207 has been fixed in place (such as via a soldering process), it can provide additional structural support for cable assembly 200. In fact, once manufacturing of cable assembly 200 is complete, an additional collar 215 may be formed over the area where metal braid 206 and micro crimp 207 interface with each other.

Printed circuit board (PCB) 210 may also include additional features in accordance with the principles of the present invention that enable a higher level of EMI protection while also increasing the overall structural integrity of cable assembly 200. In particular, printed circuit board 210 can include alignment tabs 212 that can be utilized to substantially lock the PCB in place within the shield body (shown below in FIGS. 4A-4C) without significantly impacting the overall shielding ability of cable assembly 200. Connector 218 can be soldered to a series of termination points (not shown) such that it is substantially fixed to PCB 210. The complete manufacturing process for cable assembly 200 is set forth below.

Figure 3A:
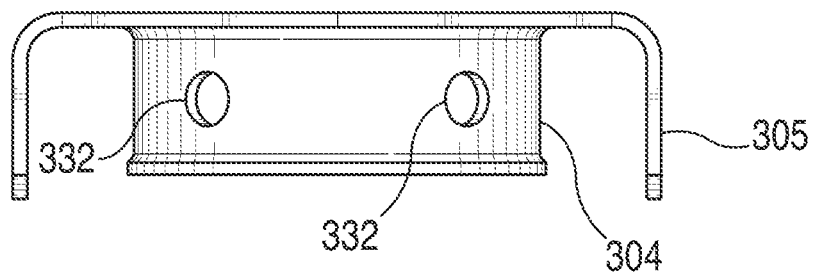
FIGS. 3A-3C show various illustrative views of a crimp used to prevent electro-magnetic interference in accordance with some embodiments of the invention.
Figure 3B:
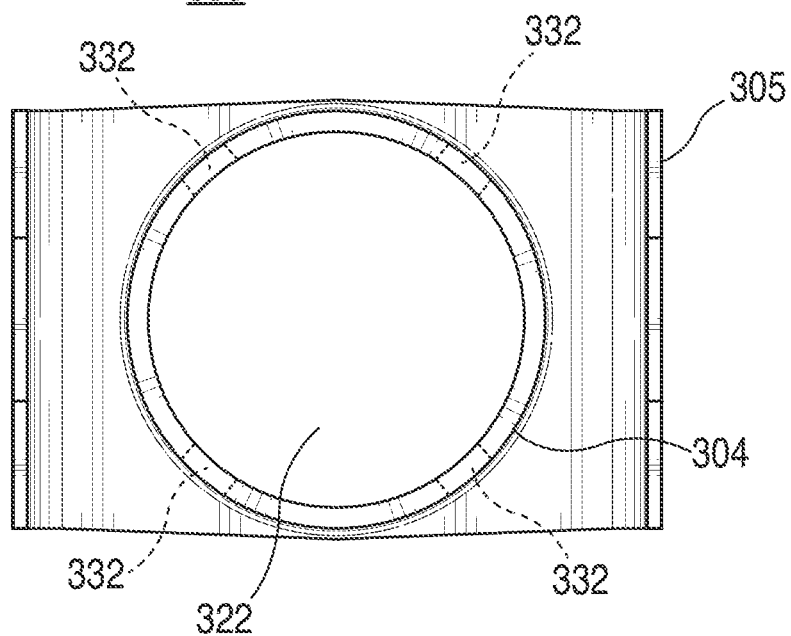
Figure 3C:
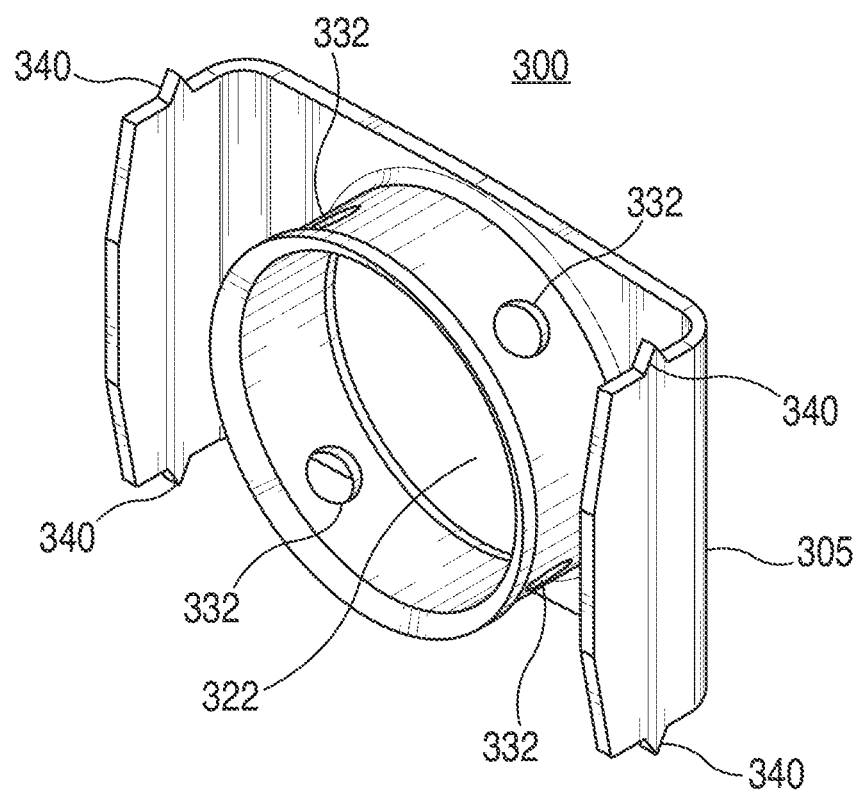

FIGS. 3A-3C show various views of micro crimp 300 that was initially described above as micro crimp 207 with respect to FIG. 2. FIG. 3A is a top view of micro crimp 300; FIG. 3B is a front view of micro crimp 300 and FIG. 3C is a three-dimensional perspective view of micro crimp 300. Micro crimp 300 includes a substantially round portion 304 and a substantially flat portion 305 (which may be formed into a "U" shape to further assist in fitting micro crimp 300 against the PCB).

Substantially round portion 304 is intended to slide over the cable itself (e.g., the cable may slide through opening 322 defined by portion 304) prior to the termination of the conductors therein. Round portion 304 can be clamped to the metal braid of the cable (such as braid 206 of FIG. 2) for mechanical retention, and eventually be crimped and soldered into place. This can further aide the manufacturing process and thereby increase the overall reliability of the design. Openings 332 may be used as access points to further enhance and enable the soldering of micro crimp 300 to the metal braid of the cable which would appear in each of openings 332 once micro crimp 300 has been slid into place on the cable (e.g., solder can be placed within one or more of openings 332 so that the solder can be applied directly to at least some locations where micro crimp 300 is in direct contact with the metal braid).

Figure 4A:
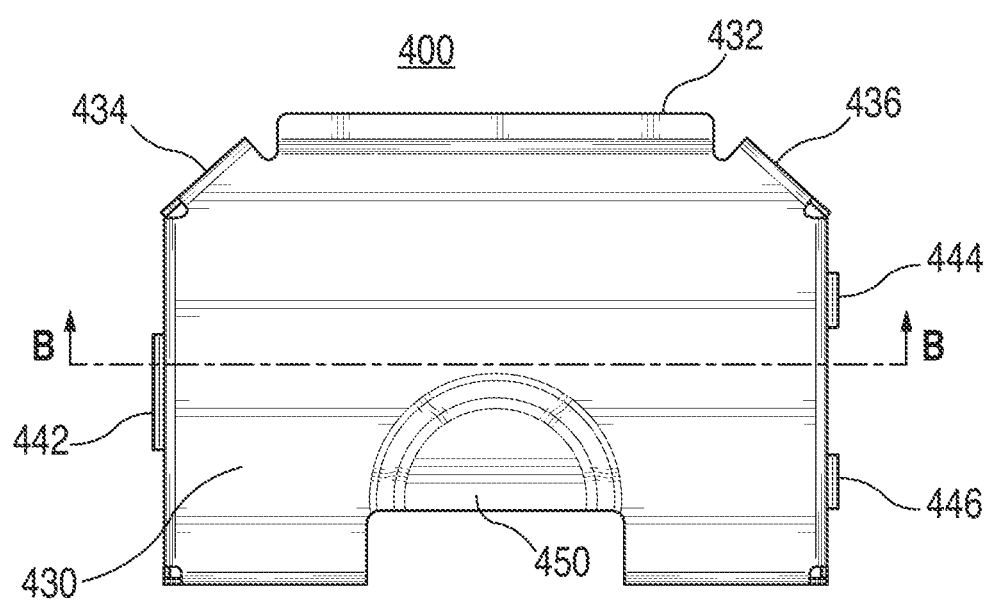
Figure 4B:
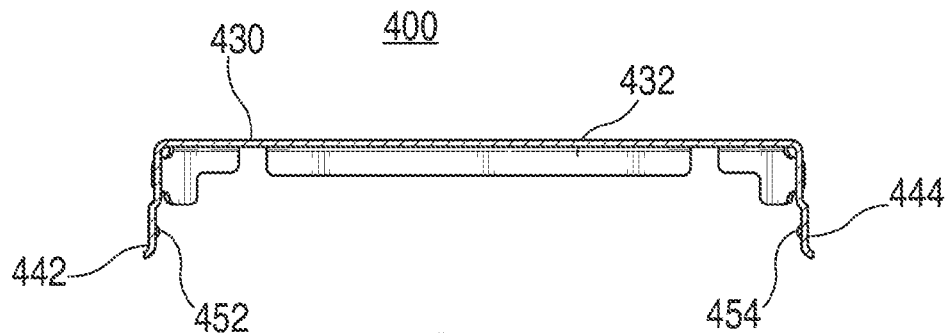
Figure 4C:
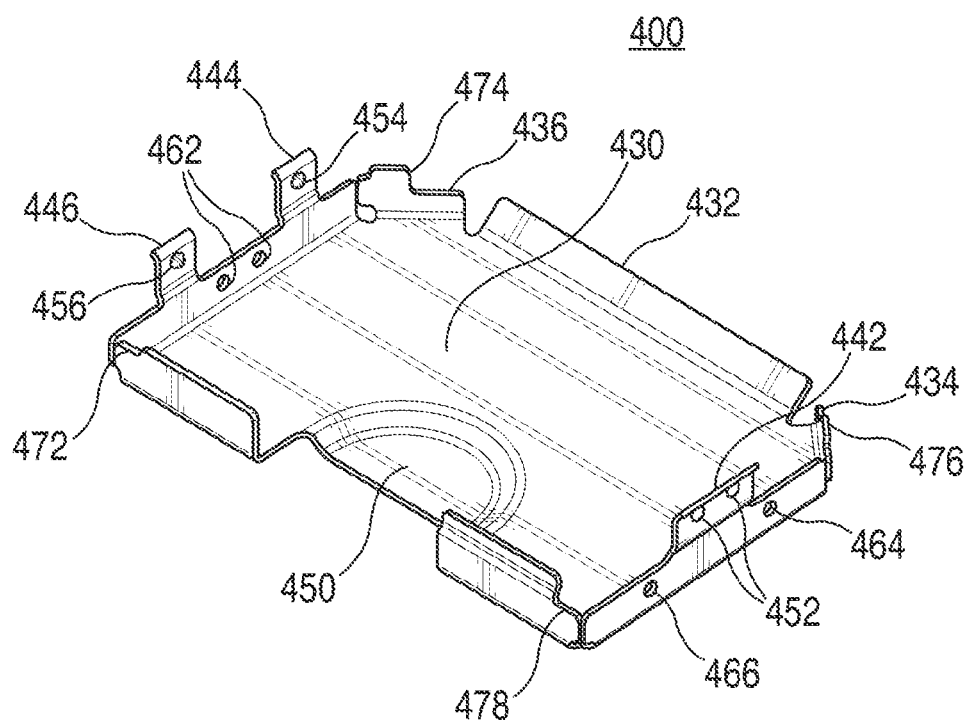

Micro crimp 300 may also include one or more tabs, such as tabs 340, which can provide a direct physical and electrical interface between micro crimp 300 and the shield body (see, for example, shield body 400 of FIGS. 4A-4C). The use of tabs 340 can increase the overall shielding ability of the entire cable assembly itself, and the use of tabs 340 can also increase the overall structural reliability of the cable assembly. In particular, micro crimp 300 can be installed such that it is located abut the printed circuit board and then clamped, crimped and soldered into place (which essentially fixes micro crimp 300 to the PCB). Tabs 340 can be used to further fix the location of the shield body by providing anchor points to which the shield body can be mounted to, thus enhancing the structural integrity of the entire cable assembly.

FIGS. 4A-4C show various views of one half of the shield body that was initially described above in general terms with respect to FIGS. 2 and 3A-3C. In particular, FIGS. 4A-4C show shield body assembly portion 400 which can be utilized to form a complete shield body, as described in more detail below. FIG. 4A is a top view of shield body portion 400; FIG. 4B is a front view of shield body portion 400 and FIG. 4C is a three-dimensional perspective view of shield body portion 400. A complete shield body would encompass two shield body portions 400 (which can be substantially the same with respect to each other) assembled together in a manner similar to a clamshell, which can substantially completely enclose the printed circuit board and all of the cable terminations. By maintaining electrical contact with the micro crimp described above, the complete assembly essentially provides a full 360 degrees of shielding around the cable's wire braid, the printed circuit board and all of the terminated conductors.

Shield body portion 400 includes cover portion 430, end tab 432, corner tabs 434 and 436, interlocking flanges 442, 444 and 446, and clearance region 450. Each of interlocking flanges 442, 446 and 446 includes one or more extensions (e.g., see extensions 452 and 454 in FIG. 4B), which are intended to substantially couple the two shield body portions together during the manufacturing process. In particular, each of extensions on the interlocking flanges 452, 454 and 456 mates with a corresponding opening 462, 464 and 466, in the other half of the complete clamshell assembly (such that the two halves should essentially snap together, and once snapped, should act as a single complete unit).

Shield body portion 400 includes clearance region 450 to provide additional area within the shield body in the region where there is likely to be the most congestion from the termination of the conductors (e.g., the area closest to where the end of the cable is and the conductors have to be fanned out). When the shield body is assembled together from two shield body portions 400 (as is described in more detail below), each of tabs 432 is in direct contact with the metal can portion of the connector (such as connector 218 of FIG. 2), tab 434 from each half is in direct contact with tab 436 from the other half, etc., such that a complete metal shell is formed, except that there can be four regions 472, 474, 476 and 478 that remain open such that the printed circuit board tabs (e.g., tabs 212 shown in FIG. 2) fit therein. In this manner, the printed circuit board is also essentially locked in place within the complete shield body, which adds additional structural integrity to the overall design. Additional reliability and shield integrity can be obtained by soldering the two shield body halves together at various locations.

Figure 5:
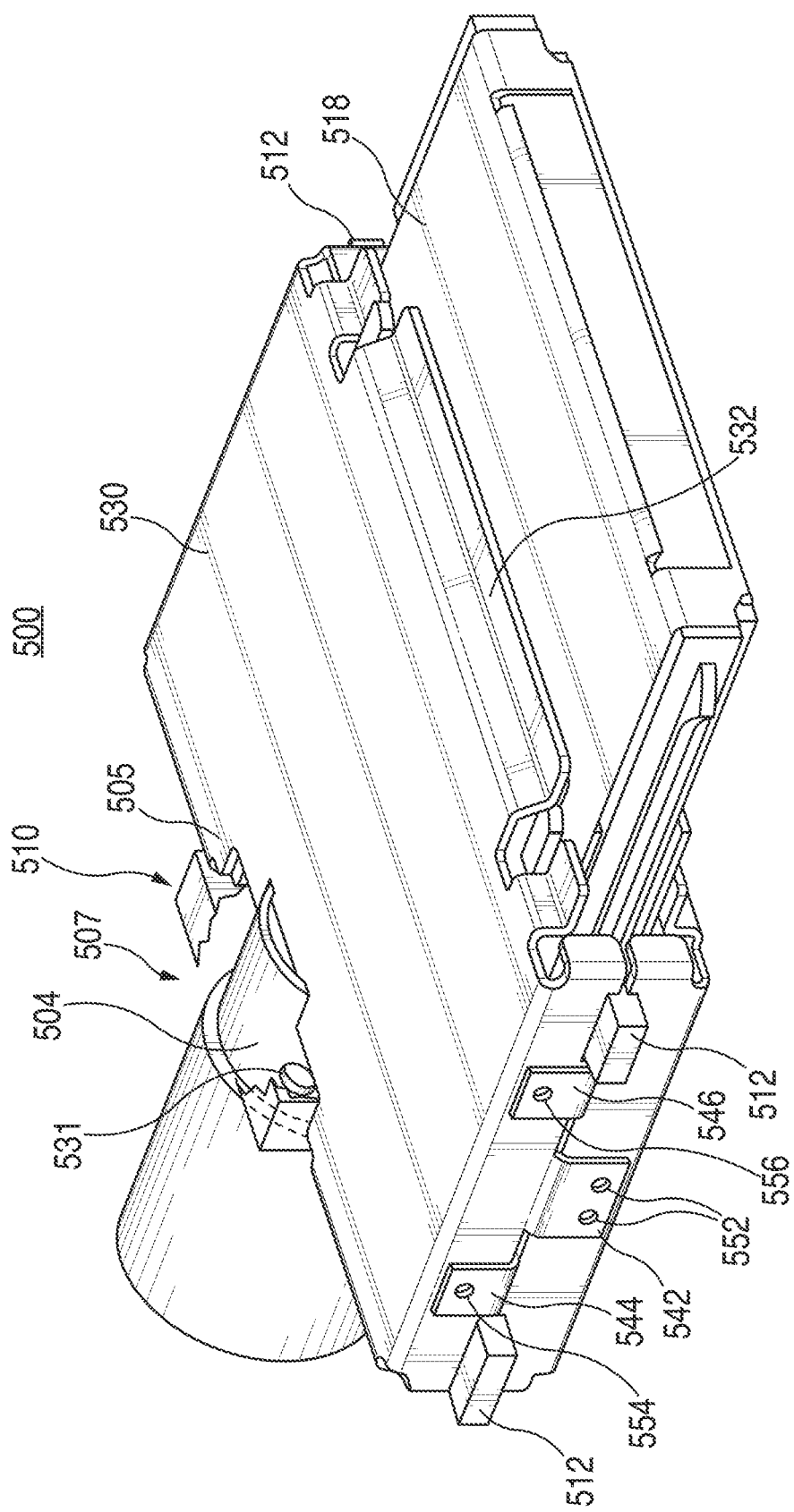
FIG. 5 is an illustrative three-dimensional view of an assembled connector that provides EMI protection in accordance with some embodiments of the invention.

FIG. 5 is an illustrative three-dimensional view of a sub-assembled EMI-protected connector 500 constructed in accordance with the principles of the present invention. Once connector 500 has been manufactured, additional assembly steps can be implemented to encase connector 500 in aesthetically-pleasing materials that prevent users from accessing the internal components of the connector. For example, a hard plastic shell (not shown) may be slipped on the cable such that connector 500 slides within the shell, and an end plug can then be inserted (having an opening for the end of the connector) to complete the assembly.

Connector 500 includes components that have been previously described with regard to FIGS. 2-4 (where FIG. 4 refers to FIGS. 4A-4C, etc.). For clarity, the last two digits of each component in FIG. 5 are intended to match the last two digits of the previously described component. For example, alignment tabs 212 of FIG. 2 are described with respect to FIG. 5 as alignment tabs 512. Thus, connector 500 includes: micro crimp 507 (which includes flat portion 505 and tubular portion 504), alignment tabs 512, connector can 518, cover portion 530, soldering holes 531 (which correspond to reference numeral 232 previously described), interlocking flanges 542, 544 and 546 (which include, respectively, extensions 552, 554 and 556), and strain relief 510 (which is molded on to the micro crimp assembly for additional reliability). Extensions 552, 554 and 556 snap-mate with the corresponding openings previously described such that the two shield bodies, when mated together, are substantially a single unit. For example, end tabs 532 can be designed such that they apply a constant pressure on connector can 518 to insure that a good electrical contact remains between the shield body (which, as previously described, is electrically coupled to the wire braid of the cable itself) and the connector.

Figure 6:
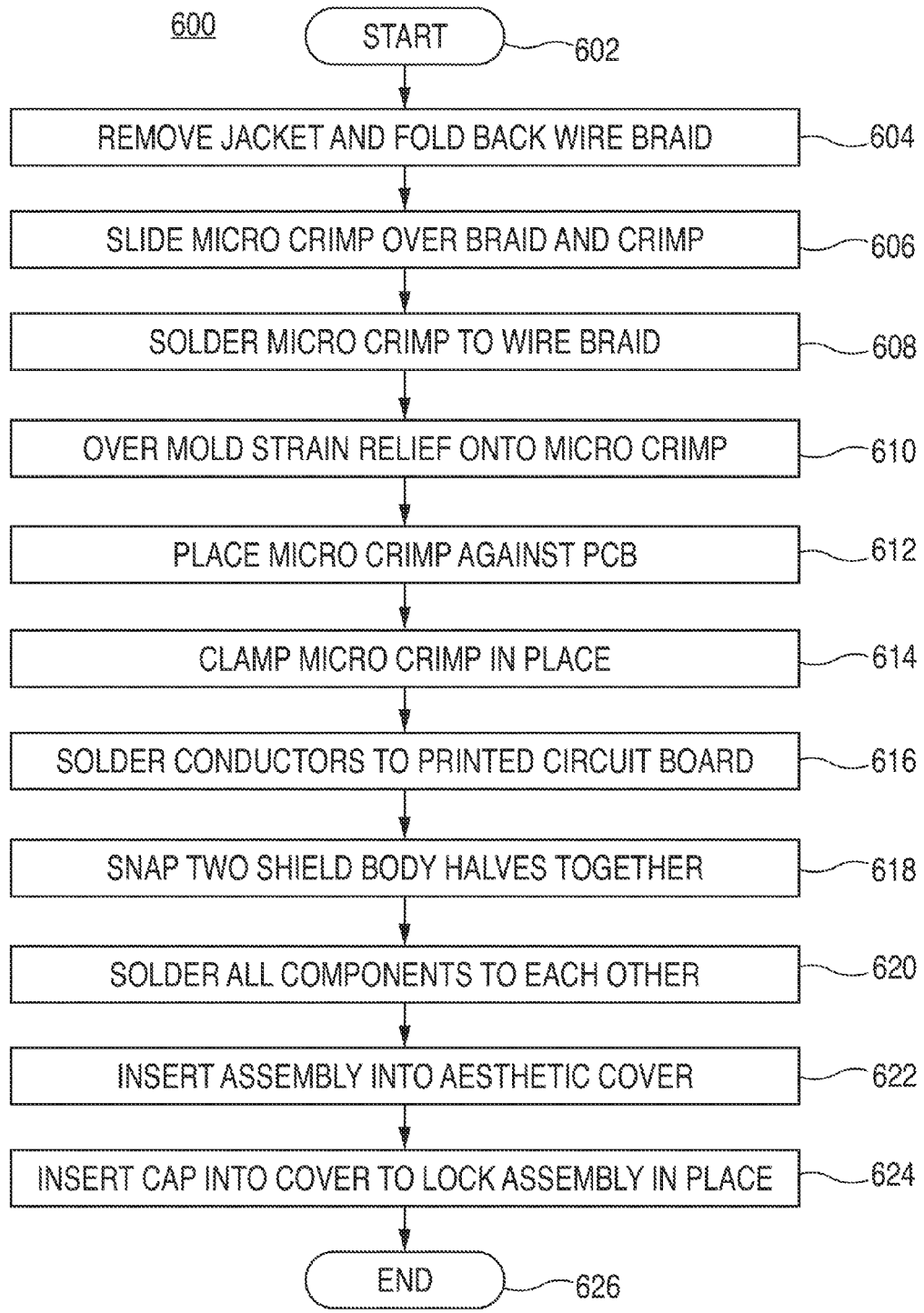
FIG. 6 is a flowchart of an illustrative process for constructing an EMI-protected cable structure in accordance with some embodiments of the invention.

FIG. 6 is a flowchart of an illustrative process for constructing an EMI-protected cable structure in accordance with some embodiments of the invention. Process 600 can begin at step 602. At step 604, the jacket is carefully removed from the end of the cable and the wire braid is bent back over outside of the cable. At step 606, the micro crimp is slid over the braid and crimped to the cable. The micro crimp is soldered to the metal braid, at step 608, through the holes in the micro crimp (such that the underlying jacket of the cable is not burned). At step 610, a strain relief is molded over the crimped and soldered assembly to add reliability and durability to the cable.

At step 612, the micro crimp is placed so that it abuts the printed circuit board (which should be preassembled with a connector can). At step 614 (which is an optional step), the micro crimp can be clamped in place for mechanical retention.

At step 616, each of the individual conductors in the cable is soldered to a particular place on the printed circuit board. At step 618, the two halves of a shield body are snapped together such that the interlocking flanges mate with each other, and such that the end tabs of each half are depressed against, and in electrical contact with, the connector can. At step 620, additional soldering can be utilized to further insure that good electrical connections are maintained from the wire braid, through the micro crimp, through the shield body to the connector can. In addition, soldering can help increase the percentage of overall encapsulation that the EMI shield has over the printed circuit board and terminated conductors. At this point in the process, the EMI shield is complete.

At step 622, the cable sub-assembly is inserted into a cover, such as a plastic cover. The plastic cover can be such that it has an opening that is just big enough for the cable and strain relief at one end, and wide open at the other end. Thus, if the other end of the cable is already assembled, then the cover needs to be placed on the cable prior to step 604 occurring. On the other hand, if the other end is to be completed later in the manufacturing process, then step 622 can occur after step 620 (because the non-terminated end of the cable can be inserted into the cover, which can then be slid up the cable until it covers the completed sub-assembly). At step 624, an end cap can be inserted into the cover to "seal" the cover. The end cap should include an opening slightly larger than the connector can so that it can help minimize movement of the connector can during insertion and extraction of the connector. Minimizing such movement will help relieve stress that might otherwise occur between the printed circuit board and the connector can. Process 600 can end at step 626.

It should be understood that the process of FIG. 6 is merely illustrative. Any of the steps may be removed, modified, or combined, and any additional steps may be added, without departing from the scope of the invention.

Manufacturing a high-speed data cable in this manner can provide several advantages. For example, the processes can provide ways to terminate a multitude of conductors in a connector that can be similar in size and aesthetics to other connectors that users are familiar with when using for their portable electronic devices. Unlike conventional high-speed data cables, which can have large, heavy and bulky connectors, the techniques described herein with respect to the present invention can provide cables that are smaller, lighter and aesthetically pleasing. This can be accomplished without compromising on performance.

The described embodiments of the invention are presented for the purpose of illustration and not of limitation.

What is claimed is:

1. A high-speed data cable assembly comprising:
   a cable comprising a plurality of conductors of which at least a portion are dedicated to high-speed data communications and a metal braid;
   a printed circuit board to which at least some of the plurality of conductors are individually terminated;
   a connector electrically and physically coupled to the printed circuit board;
   a shield body that substantially encapsulates the printed circuit board and is electrically and physically coupled to the connector; and
   a micro crimp that is electrically and physically coupled to the metal braid and to the shield body, wherein the micro crimp comprises:
      a flat portion that forms a portion of the shield body; and
      a tubular portion that substantially covers the metal braid, wherein the tubular portion comprises a plurality of openings that provide direct access to the covered metal braid.

2. The cable assembly of claim 1 further comprising:
   a strain relief that is overmolded on the cable such that it substantially covers the micro crimp.

3. The cable assembly of claim 1, wherein the printed circuit board comprises:
   at least one alignment tab that is secured in place by the shield body.

4. The cable assembly of claim 3, wherein the at least one alignment tab comprises:
   a plurality of alignment tabs that are secured by the shield body.

5. The cable assembly of claim 1, wherein the shield body comprises:
   a first half that comprises an end tab that, when assembled, is applied under pressure to a portion of the connector such that electric contact is maintained between the end tab and the portion of the connector; and
   a second half that is substantially identical to the first half, the first and second halves being mated together to form the shield body.

6. The cable assembly of claim 5, wherein each of the first and second halves further comprises:
   a plurality of interlocking flanges; and
   a plurality of openings that correspond to and are aligned with the interlocking portion of each flange, such that when the two halves are assembled together the interlocking flanges act to keep the halves together.

7. The cable assembly of claim 6, wherein the shield body further comprises:
   a plurality of solder joints that provide electrical connectivity between: the first and second halves, the shield body and the micro crimp, and the shield body and the connector.

8. The cable assembly of claim 1, wherein the micro crimp further comprises:
   solder applied to the plurality of openings that electrically and physically couples the micro crimp to the metal braid.

9. The cable assembly of claim 1, wherein the micro crimp further comprises:
   a plurality of electrically conductive tabs that physically connect the micro crimp to the shield body.

10. The cable assembly of claim 1, wherein the connector comprises:
    a 30 pin connector capable of being directly connected to a portable electronic device.

11. The cable assembly of claim 1, wherein the conductors of the plurality of conductors are configured to communicate signals in compliance with a standard associated with a high-definition multimedia interface.

12. An assembly comprising:
    a cable comprising:
       at least one conductor; and
       a shield layer extending along at least a portion of the at least one conductor;
    a termination component to which at least one of the at least one conductor is terminated; and
    a crimp that surrounds a portion of the shield layer and that abuts the termination component, wherein the crimp comprises at least one opening that provides access to the portion of the shield layer through the crimp.

13. The assembly of claim 12, further comprising solder within at least one of the at least one opening, wherein the solder electrically and physically couples the crimp to the shield layer.

14. The assembly of claim 12, wherein the crimp comprises:
    a first portion that surrounds the portion of the shield layer, wherein the first portion comprises the at least one opening that provides access to the portion of the shield layer through the first portion; and
    a second portion coupled to and extending from the first portion, wherein the second portion abuts the termination component.

15. The assembly of claim 12, further comprising a shield body that shields at least a portion of the termination component, wherein the crimp comprises:
    a first portion that surrounds the portion of the shield layer, wherein the first portion comprises the at least one opening that provides access to the portion of the shield layer through the first portion; and
    a second portion coupled to and extending from the first portion, wherein the second portion contacts the shield body such that the crimp electrically and physically couples the shield layer to the shield body.

16. An assembly comprising:
    a cable comprising:
       at least one conductor; and
       a shield layer extending along at least a portion of the at least one conductor;

a termination component to which at least one of the at least one conductor is terminated;

a shield body that shields at least a portion of the termination component; and a crimp that electrically and physically couples the shield layer to the shield body, wherein the crimp comprises at least one opening that provides access to the shield layer through the crimp.

17. The assembly of claim 16, further comprising solder within at least one of the at least one opening, wherein the solder electrically and physically couples the crimp to the shield layer.

18. The assembly of claim 16, wherein the crimp comprises:

a first portion that surrounds a portion of the shield layer, wherein the first portion comprises the at least one opening that provides access to the portion of the shield layer through the first portion; and a second portion extending from an open end of the first portion, wherein the second portion contacts the shield body.

19. The assembly of claim 18, wherein:

the first portion comprises a tubular shape;

the second portion comprises a flat portion that extends away from an open end of the tubular shape; and the second portion comprises at least one tab extending from the flat portion that contacts the shield body.

20. The assembly of claim 18, wherein:

the first portion comprises a tubular shape;

the second portion comprises a flat portion that extends away from an open end of the tubular shape; and the flat portion abuts the termination component.

* * * * *